(12) United States Patent
Doan

(10) Patent No.: US 6,301,006 B1
(45) Date of Patent: *Oct. 9, 2001

(54) ENDPOINT DETECTOR AND METHOD FOR MEASURING A CHANGE IN WAFER THICKNESS

(75) Inventor: Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/500,171

(22) Filed: Feb. 8, 2000

Related U.S. Application Data

(63) Continuation of application No. 09/066,044, filed on Apr. 24, 1998, now Pat. No. 6,075,606, which is a continuation-in-part of application No. 08/602,617, filed on Feb. 16, 1996, now Pat. No. 5,777,739.

(51) Int. Cl.$^7$ ..................................................... G01B 11/06
(52) U.S. Cl. ............................................................. 356/381
(58) Field of Search ..................................... 356/381, 357, 356/382, 485, 503; 438/16, 692, 690, 691, 757, 753, 747; 216/84; 451/285–289; 156/636.1

(56) References Cited

U.S. PATENT DOCUMENTS

| | | |
|---|---|---|
| 4,200,395 | 4/1980 | Smith et al. . |
| 4,203,799 | 5/1980 | Sugawara et al. . |
| 4,358,338 | 11/1982 | Downey et al. . |
| 4,367,044 | 1/1983 | Booth, Jr. et al. . |
| 4,377,028 | 3/1983 | Imakeshi . |
| 4,422,764 | 12/1983 | Eastman . |
| 4,640,002 | 2/1987 | Phillips et al. . |
| 4,660,980 | 4/1987 | Takabayashi et al. . |
| 4,717,255 | 1/1988 | Ulbers . |
| 4,879,258 | 11/1989 | Fisher . |
| 5,036,015 | 7/1991 | Sandhu et al. . |
| 5,081,796 | 1/1992 | Schultz . |
| 5,220,405 | 6/1993 | Barbee et al. . |
| 5,324,381 | 6/1994 | Nishiguchi . |

(List continued on next page.)

FOREIGN PATENT DOCUMENTS 0 623 423   11/1994  (EP) .

*Primary Examiner*—Frank G. Font
*Assistant Examiner*—Tu T. Nguyen
(74) *Attorney, Agent, or Firm*—Perkins Cole LLP

(57) ABSTRACT

An endpoint detector and performance monitoring system for quickly and accurately measuring the change in thickness of a wafer and other planarizing parameters in chemical-mechanical polishing processes. In one embodiment, an endpoint detector has a reference platform, a measuring face, and a distance measuring device. The reference platform is positioned proximate to the wafer carrier, and the reference platform and measuring device are positioned apart from one another by a known, constant distance. The measuring face is fixedly positioned with respect to the wafer carrier at a location that allows the measuring device to engage the measuring face when the wafer is positioned on the reference platform. Each time the measuring device engages the measuring surface, it measures the displacement of the measuring face with respect to the measuring device. The displacement of the measuring face is proportional to the change in thickness of the wafer between measurements. In another embodiment, a planarizing machine has a flat plate, a planarizing medium fastened to the plate, a carrier assembly to manipulate a substrate holder over the planarizing medium, and a non-contact distance measuring device. The non-contact distance measuring device measures the actual elevation of the substrate holder as the substrate holder engages a substrate with the planarizing medium and relative motion occurs between the substrate holder and the planarizing medium. The performance monitoring system uses the actual pad elevation to determine the endpoint, the polishing rate and other CMP operating parameters.

39 Claims, 7 Drawing Sheets

U.S. PATENT DOCUMENTS

| | | |
|---|---|---|
| 5,369,448 | 11/1994 | Morokuma . |
| 5,393,624 | 2/1995 | Ushijima . |
| 5,416,941 | 5/1995 | Koos et al. . |
| 5,433,651 | 7/1995 | Lustig et al. . |
| 5,461,007 | 10/1995 | Kobayashi . |
| 5,465,154 | 11/1995 | Levy . |
| 5,609,718 | 3/1997 | Meikle . |
| 5,667,424 | 9/1997 | Pan . |
| 5,738,562 | 4/1998 | Doan et al. . |
| 5,777,739 | 7/1998 | Sandhu et al. . |
| 5,791,969 | 8/1998 | Lund . |

ENDPOINT DETECTOR AND METHOD FOR MEASURING A CHANGE IN WAFER THICKNESS

CROSS-REFERENCE TO RELATED APPLICATIONS

This application is a Continuation of pending U.S. patent application Ser. No. 09/066,044, filed on Apr. 24, 1998, which issued as U.S. Pat. No. 6,075,606 on Jun. 13, 2000, which is a continuation-in-part of U.S. patent application Ser. No. 08/602,617, filed on Feb. 16, 1996, allowed on Oct. 2, 1997 now U.S. Pat. No. 5,777,739.

TECHNICAL FIELD

The present invention relates to an endpoint detector and a method for quickly and accurately measuring a change in thickness of a semiconductor wafer or another microelectronic substrate in mechanical or chemical-mechanical polishing processes.

BACKGROUND OF THE INVENTION

Chemical-mechanical polishing or mechanical polishing processes (collectively "CMP") remove material from the surface of a microelectronic substrate (e.g., a semiconductor wafer) in the production of ultra-high density integrated circuits. In a typical CMP process, a wafer is pressed against a planarizing medium (e.g., a polishing pad) in the presence of a planarizing fluid (e.g., an abrasive slurry under controlled chemical, pressure, velocity, and temperature conditions. The planarizing fluid may contain small, abrasive particles to abrade the surface of the wafer, but a non-abrasive planarizing fluid may be used with fixed-abrasive polishing pads. Additionally, the planarizing fluid has chemicals that etch and/or oxidize the surface of the wafer. The polishing pad is generally a planar pad made from a porous material such as blown polyurethane, and it may also have abrasive particles bonded to the material. Thus, when the pad and/or the wafer moves with respect to the other, material is removed from the surface of the wafer by the abrasive particles (mechanical removal) and the chemicals (chemical removal).

FIG. 1 schematically illustrates a conventional CMP machine 10 with a platen 20, a wafer carrier 30, a polishing pad 40, and a slurry 44 on the polishing pad. The platen 20 has a surface 22 upon which the polishing pad 40 is positioned. A drive assembly 26 rotates the platen 20 as indicated by arrow "A". In another type of existing CMP machine, the drive assembly 26 reciprocates the platen back and forth as indicated by arrow "B". The motion of the platen 20 is imparted to the pad 40 because the polishing pad 40 frictionally engages the surface 22 of the platen 20. The wafer carrier 30 has a lower surface 32 to which a wafer 60 may be attached, or the wafer 60 may be attached to a resilient pad 34 positioned between the wafer 60 and the lower surface 32. The wafer carrier 30 may be a weighted, free-floating wafer carrier, or an actuator assembly 36 may be attached to the wafer carrier 30 to impart axial and rotational motion, as indicated by arrows "C" and "D", respectively.

In the operation of the conventional polisher 10, the wafer 60 is positioned face-downward against the polishing pad 40, and then the platen 20 and the wafer carrier 30 move relative to one another. As the face of the wafer 60 moves across the planarizing surface 42 of the polishing pad 40, the polishing pad 40 and the slurry 44 remove material from the wafer 60.

In the competitive semiconductor industry, it is highly desirable to maximize the throughput of CMP processes to produce accurate, planar surfaces as quickly as possible. The throughput of CMP processes is a function of several factors, one of which is the ability to accurately stop the CMP process at a desired endpoint. Accurately stopping the CMP process at a desired endpoint is important to maintaining a high throughput because the thickness of the dielectric layer must be within an acceptable range; if the thickness of the dielectric layer is not within an acceptable range, the wafer must be re-polished until it reaches the desired endpoint. Re-polishing a wafer, however, significantly reduces the throughput of CMP processes. Thus, it is highly desirable to stop the CMP process at the desired endpoint.

In one conventional method for determining the endpoint of the CMP process, the polishing period of one wafer in a run is estimated using the polishing rate of previous wafers in the run. The estimated polishing period for the wafer, however, may not be accurate because the polishing rate may change from one wafer to another. Thus, this method may not accurately polish the wafer to the desired endpoint.

In another method for determining the endpoint of the CMP process, the wafer is removed from the pad and wafer carrier, and then the thickness of the wafer is measured. Removing the wafer from the pad and wafer carrier, however, is time-consuming and may damage the wafer. Moreover, if the wafer is not at the desired endpoint, then even more time is required to re-mount the wafer to the wafer carrier for repolishing. Thus, this method generally reduces the throughput of the CMP process.

In still another method for determining the endpoint of the CMP process, a portion of the wafer is moved beyond the edge of the pad, and an interferometer directs a beam of light directly onto the exposed portion of the wafer. The wafer, however, may not be in the same reference position each time it overhangs the pad because the edge of the pad is compressible, the wafer may pivot when it overhangs the pad, and the exposed portion of the wafer may vary from one measurement to the next. Thus, this method may inaccurately measure the change in thickness of the wafer.

In light of the problems with conventional endpoint detection techniques, it would be desirable to develop an apparatus and a method for quickly and accurately measuring the change in thickness of a wafer during the CMP process.

In addition to accurately determining the endpoint of CMP processes, it is also desirable to monitor other performance characteristics or parameters to maintain the throughput and quality of finished wafers. The performance of CMP processes may be affected by the pad condition, the distribution of planarizing fluid under the wafer, and many other planarizing parameters. Monitoring these parameters, however, is difficult because it is time consuming to interrupt processing wafers to determine whether one of the parameters has changed. Moreover, if the CMP process is stopped and all of the parameters appear to be in an acceptable range, it is a complete waste of processing time. Thus, it would also be desirable to monitor the performance of CMP processing to ensure that the planarizing parameters are within acceptable operating ranges without interrupting the process.

SUMMARY OF THE INVENTION

The invention is directed, in part, to detecting the endpoint of a planarization process that removes material from a microelectronic substrate, such as a semiconductor wafer. An endpoint detector measures the change in thickness of a semiconductor wafer while the wafer is attached to a wafer carrier during chemical-mechanical polishing of the wafer. The endpoint detector has a reference platform, a measuring face, and a distance measuring device. The reference platform is positioned proximate to the wafer carrier, and the reference platform and measuring device are positioned apart from one another by a known, constant distance for all of the measurements of a single wafer. The measuring face is fixedly positioned with respect to the wafer carrier at a location that allows the measuring device to engage the measuring face when the wafer is positioned on the reference platform. Each time the measuring device engages the measuring surface, it measures the displacement of the measuring face with respect to the measuring device. The displacement of the measuring face is proportional to the change in thickness of the wafer between measurements.

In a method in accordance with the invention, the wafer is placed on the reference platform before it is polished, and then the measuring device engages the measuring surface to determine a baseline measurement of the position of the measuring face with respect to the measuring device. After the wafer is at least partially polished, the wafer is re-placed on the reference platform and the measuring device is re-engaged with the measuring face to determine a subsequent measurement of the position of the measuring face with respect to the measuring device. The displacement of the measuring face from the baseline measurement to the subsequent measurement is proportionate to the change in thickness of the wafer.

The invention is also directed towards planarizing machines and methods for monitoring the polishing rate, endpoint, and other planarizing parameters of CMP processes. A planarizing machine in accordance with the invention includes a flat plate, a planarizing medium fastened to the plate, a carrier assembly to manipulate a substrate with respect to the planarizing medium, and a non-contact distance measuring device. The carrier assembly, more specifically, may have a support structure and a substrate holder coupled to the support structure. The substrate holder typically has a mounting site facing the planarizing medium to carry the substrate, and a backside facing away from the planarizing medium. The non-contact distance measuring device may also be attached to the support structure to be positioned over the substrate holder for at least a portion of the planarizing process. Additionally, the support structure typically holds the non-contact measuring device at a known elevation with respect to the plate to measure an actual distance between the backside of the substrate holder and the known elevation while the substrate is planarized.

The distance measuring device may have a beam emitter that projects a source beam, a reflector positioned at a predetermined angle with respect to the plate to direct the source beam against the backside of the substrate holder, and a primary detector to receive a return beam reflected from the backside of the substrate holder normal to the source beam. The primary detector monitors a lateral shift of the return beam and provides a signal to a processor that determines the distance between the backside of the substrate holder and the intersection between the source beam and the return beam. Accordingly, the distance measuring device may measure a first actual distance at one stage of the planarization process and then re-measure a second actual distance at a subsequent stage of the planarization process to determine the change in thickness of the substrate, the polishing rate of the substrate and several other performance parameters of the planarization process while the substrate is planarized.

DETAILED DESCRIPTION OF THE INVENTION

The present invention is directed toward performance monitoring systems, such as an endpoint detector that quickly and accurately measures a change in wafer thickness of a semiconductor wafer or another type of microelectronic substrate during chemical-mechanical polishing of the wafer. One aspect of the invention is to provide a reference platform upon which the wafer is positioned each time a measurement is taken. Another aspect of the invention is to provide a measuring face on the wafer carrier that may be engaged by a measuring device without removing the wafer from either the reference platform or the wafer carrier. As will be discussed in greater detail below, by providing such a reference platform and a measuring face, the change in wafer thickness can be quickly and accurately measured while the wafer is attached to the wafer carrier and positioned on the reference platform. In addition to measuring the change in wafer thickness, certain embodiments of performance monitoring systems according to the invention may also determine the actual elevation of the wafer carrier with respect to a known elevation to monitor the endpoint, the polishing rate, and several other performance parameters of CMP processes. Many specific details of certain embodiments of the invention are set forth in FIGS. 2–7 to provide a thorough understanding of such embodiments. One skilled in the art, however, will understand that the present invention may have additional embodiments and may be practiced without several of the details described in the following detailed description of the invention.

Figure 1:
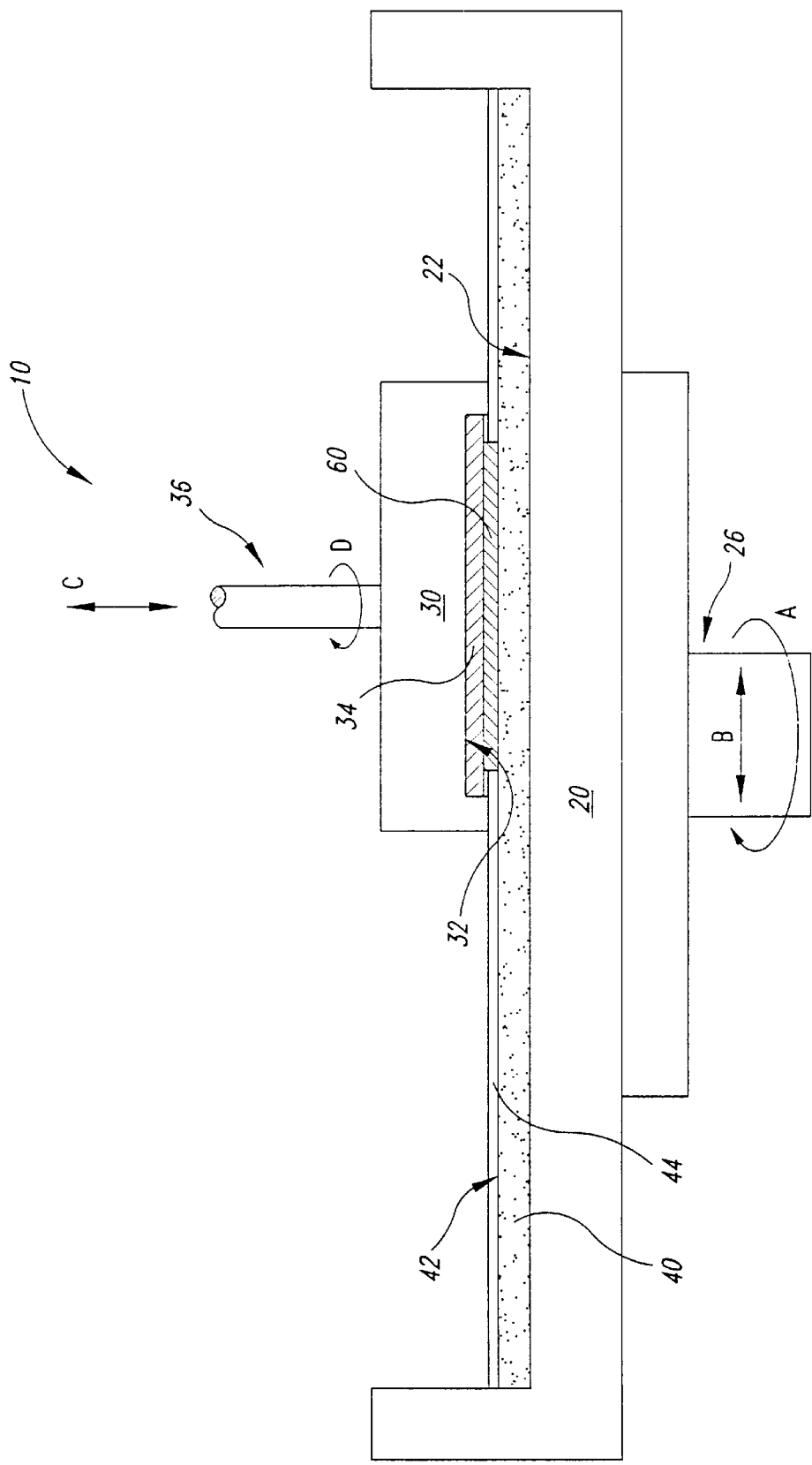
FIG. 1 is a schematic cross-sectional view of a conventional chemical-mechanical polishing machine in accordance with the prior art.
Figure 2:
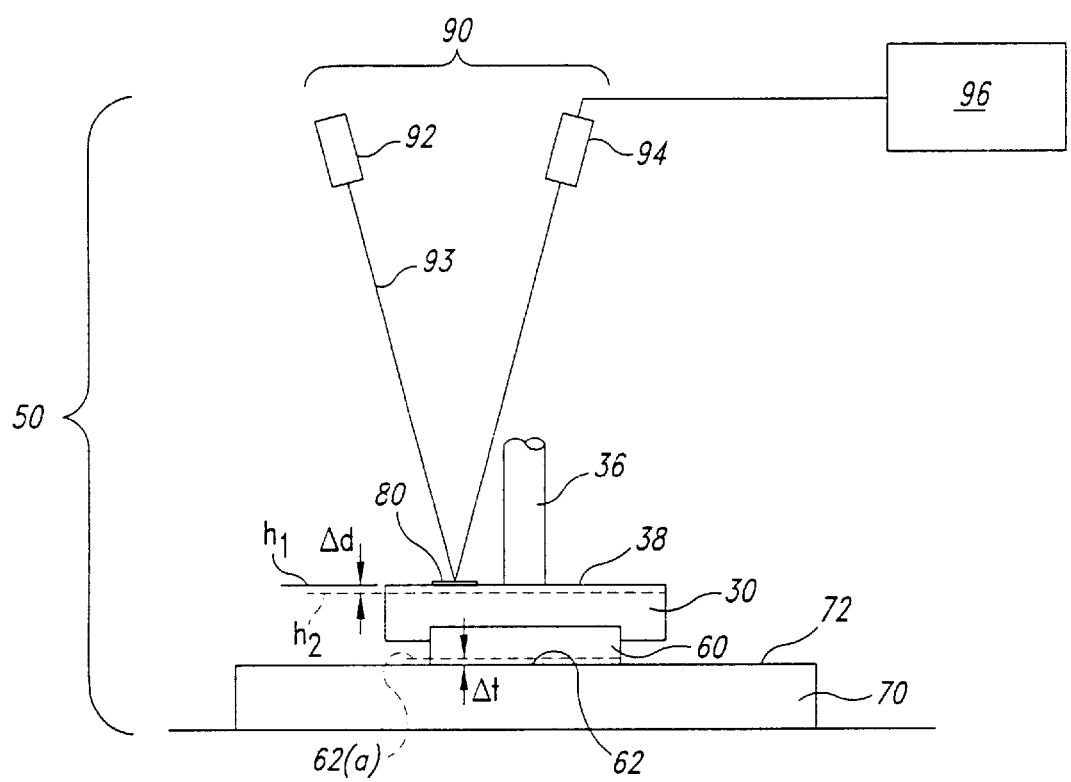
FIG. 2 is a schematic cross-sectional view of an endpoint detector in accordance with the invention.

FIG. 2 illustrates an endpoint detector 50 used in a conventional CMP machine in which a wafer 60 or another type of microelectronic substrate is mounted in a substrate holder or wafer carrier 30. The wafer carrier 30 is typically attached to an actuator 36 that manipulates the wafer carrier 30. The endpoint detector 50 includes a reference platform 70, a measuring face 80 on the wafer carrier 30, and a measuring device 90. An upper surface 72 on the reference platform 70 is maintained at a fixed distance from the measuring device 90 over all of the measurements of a single wafer. The measuring face 80 is positioned on an upper face 38 of the wafer carrier 30 so that it is exposed to the measuring device 90 when the wafer carrier 30 presses the wafer 60 against the reference surface 70. The measuring face 80 is preferably a planar, reflective surface that is either the upper surface 38 of the wafer carrier itself, or a separate panel attached to the wafer carrier 80. The measuring device 90 engages the measuring face 80 to measure the displacement of the measuring face 80 with respect to the fixed position of the measuring device 90.

In one embodiment, the measuring device is an interferometer with an emitter 92 and a receiver 94. The emitter directs a beam of light onto the measuring face 80, which reflects the light beam back to the receiver 94. As the distance between the measuring face 80 and the measuring device 90 changes in correspondence to the change in thickness of the wafer 60, the phase of the reflected light beam at the receiver 94 changes accordingly. A controller 96 connected to the receiver 94 translates the phase change of the reflected light beam into a measurement of the vertical displacement of the measuring face 80 with respect to the position of the measuring device 90. Importantly, both the reference platform 70 and the measuring device 90 are fixed against displacement with respect to each other to maintain a constant distance therebetween over all of the measurements of a single wafer. The distance between the reference platform 70 and the measuring device 90, however, may change from one wafer to another. The endpoint detector 50, therefore, eliminates one variable of many conventional endpoint techniques that commonly produces inaccurate measurements of the change in thickness of the wafer 60.

In operation, the wafer carrier 30 initially places the wafer 60 on the upper surface 72 of the reference platform 70 before the wafer 60 is polished When the wafer 60 is initially placed on the reference platform 70, the measuring face 80 is positioned at a height $h_1$, with respect to the measuring device 90. The emitter 92 then directs the light beam 93 onto the measuring face 80 to determine a baseline measurement of the position of the measuring face 80 at the height $h_1$. After the baseline measurement is obtained, the wafer is polished for a period of time. The change in thickness of the wafer ($\Delta t$) is equal to the distance between an original surface 62 of the wafer and a new surface 62($a$). The wafer 60 is then re-placed on the upper surface 72 of the reference platform 70, and the position of the measuring face 80 accordingly changes to a height $h_2$. The light beam 93 from the measuring device 90 re-engages the measuring face 80 to measure the displacement ($\Delta d$) of the measuring face 80 at the height $h_2$. The displacement $\Delta d$ of the measuring face 80 is proportional to, and may directly correspond to, the change in thickness $\Delta t$ of the wafer 60.

One advantage of the endpoint detector 50 is that it provides highly accurate measurements of the change in thickness $\Delta t$ of the wafer 60. An aspect of the invention is that the distance is constant between the upper surface 72 of the reference platform 70 and the measuring device 90 over all of the measurements of a single wafer. Accordingly, the displacement $\Delta d$ of the measuring surface 80 is caused by the change in thickness $\Delta t$ of the wafer 60. Moreover, by measuring the displacement of the measuring face 80, the wafer 60 does not need to overhang the reference platform 70 as in conventional techniques that directly impinge the wafer with a light beam. The endpoint detector 50, therefore, provides highly accurate measurements of the change in thickness $\Delta t$ of the wafer 60.

Figure 3:
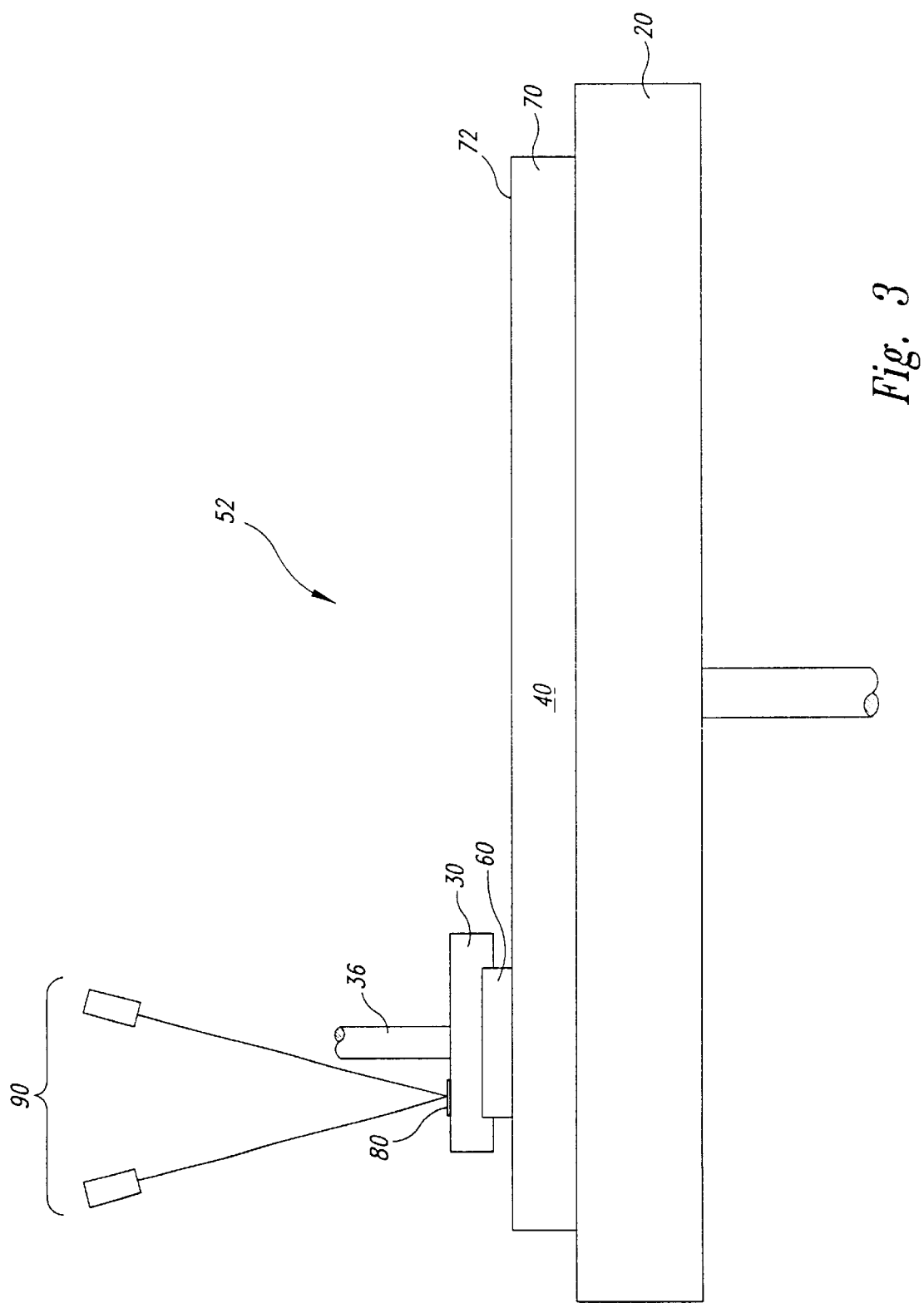
FIG. 3 is a schematic cross-sectional view of a polisher with an endpoint detector in accordance with the invention.

FIG. 3 schematically illustrates a polishing machine 52 with an endpoint detector in accordance with the invention. In this embodiment, the reference platform 70 is the polishing pad 40. The upper surface 72 of the platform 70 is accordingly the upper surface of the polishing pad 40. The wafer carrier 30 places the wafer 60 on the polishing pad/reference platform 70 to polish the wafer 60 and to measure the change in thickness of the wafer 60. When the wafer carrier 30 is positioned substantially under the measuring device, the measuring device 90 engages the measuring face 80. In operation, the change in thickness of the wafer is measured as described above with respect to FIG. 2. This embodiment of the invention is particularly useful for rigid pads or semi-rigid pads that compress substantially less than the change in thickness of the wafer. However, even if the polishing pad/reference platform 70 is compressible, the measurements made by the endpoint detector of the polishing machine 52 will be accurate as long as any force exerted on the pad/platform 70 is the same for all measurements. The polishing machine 52 quickly measures the change in thickness of the wafer 60 because the wafer 60 is not removed from either the wafer carrier 30 or the polishing pad/reference platform 70. Therefore, this particular embodiment of the invention enhances the throughput compared to conventional CMP processes.

Figure 4:
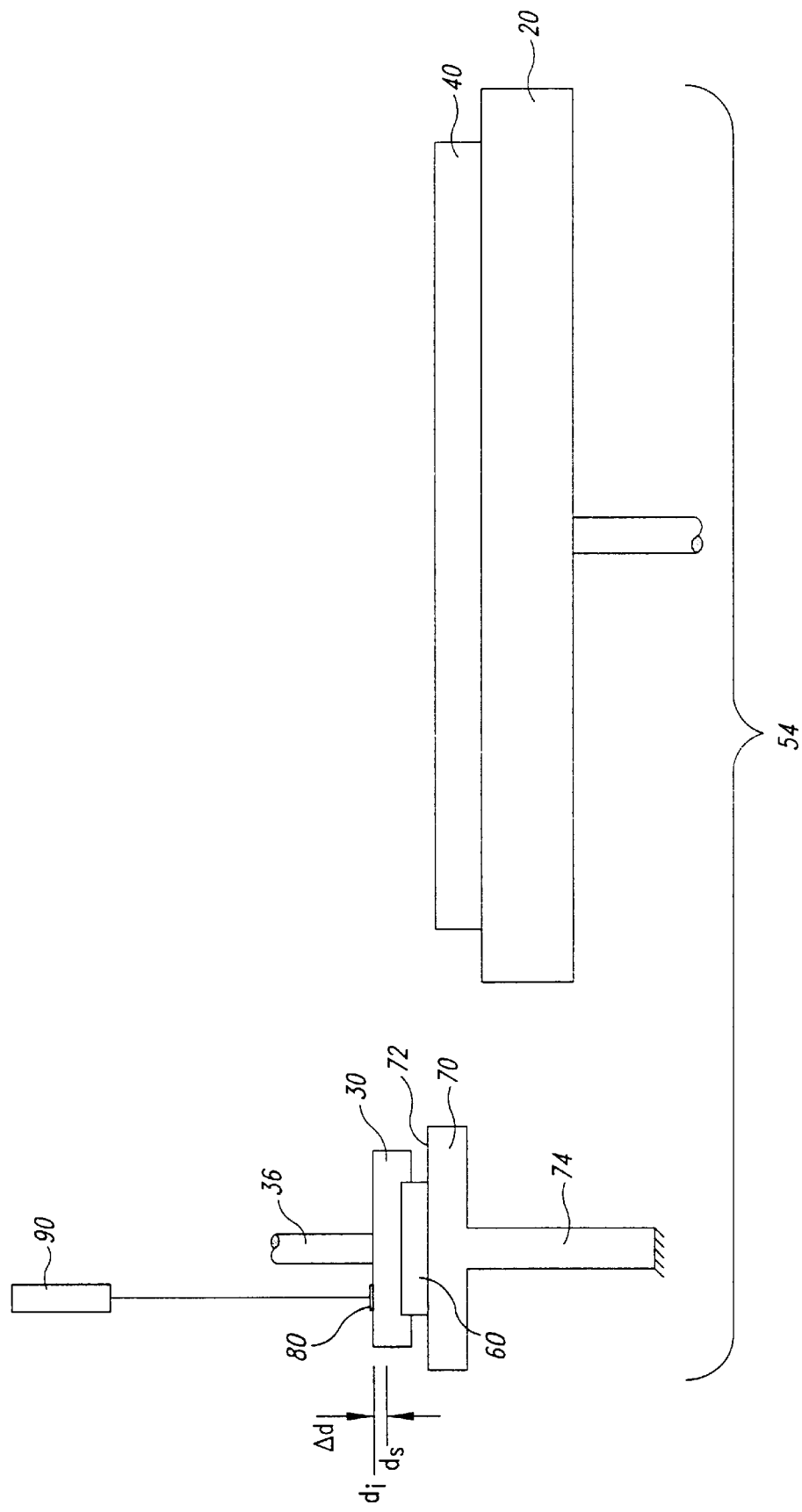
FIG. 4 is a schematic cross-sectional view of a polisher with an endpoint detector in accordance with the invention.
Figure 5:
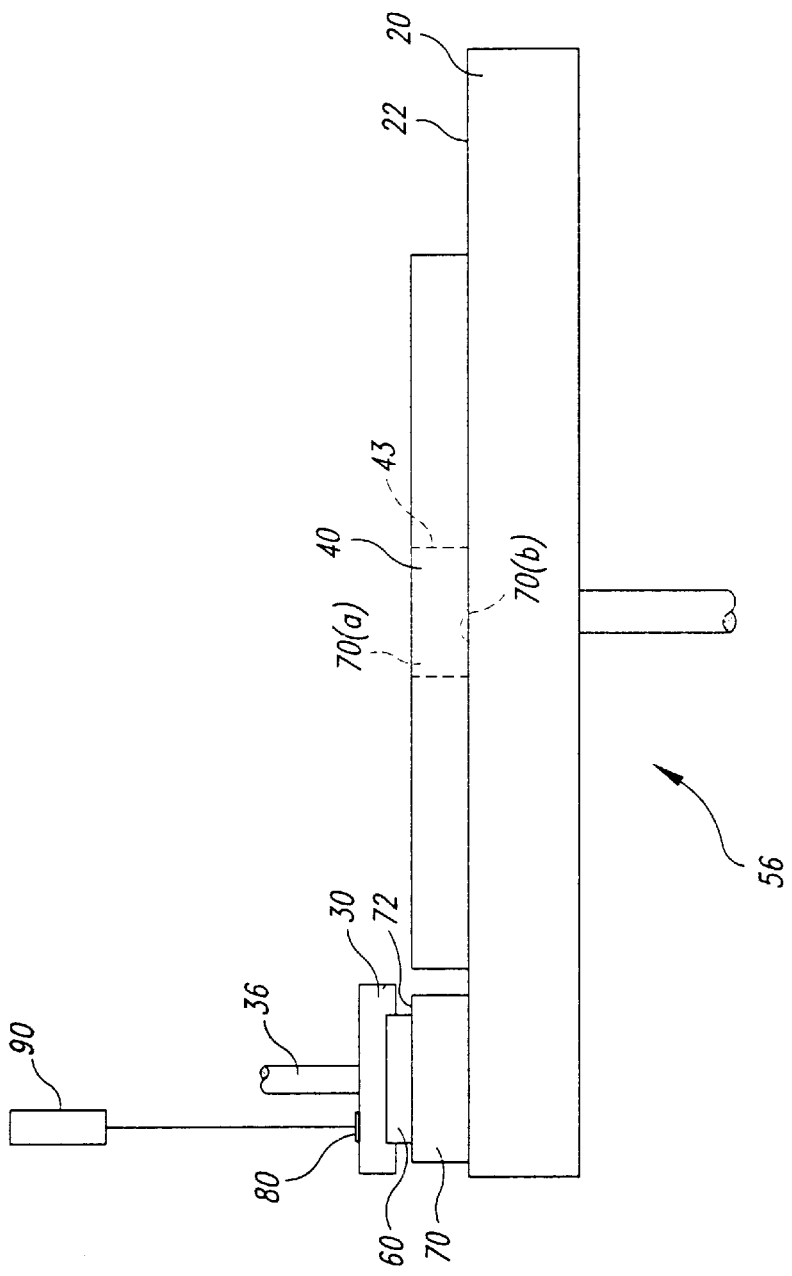
FIG. 5 is a schematic cross-sectional view of a polisher with an endpoint detector in accordance with the invention.
Figure 6:
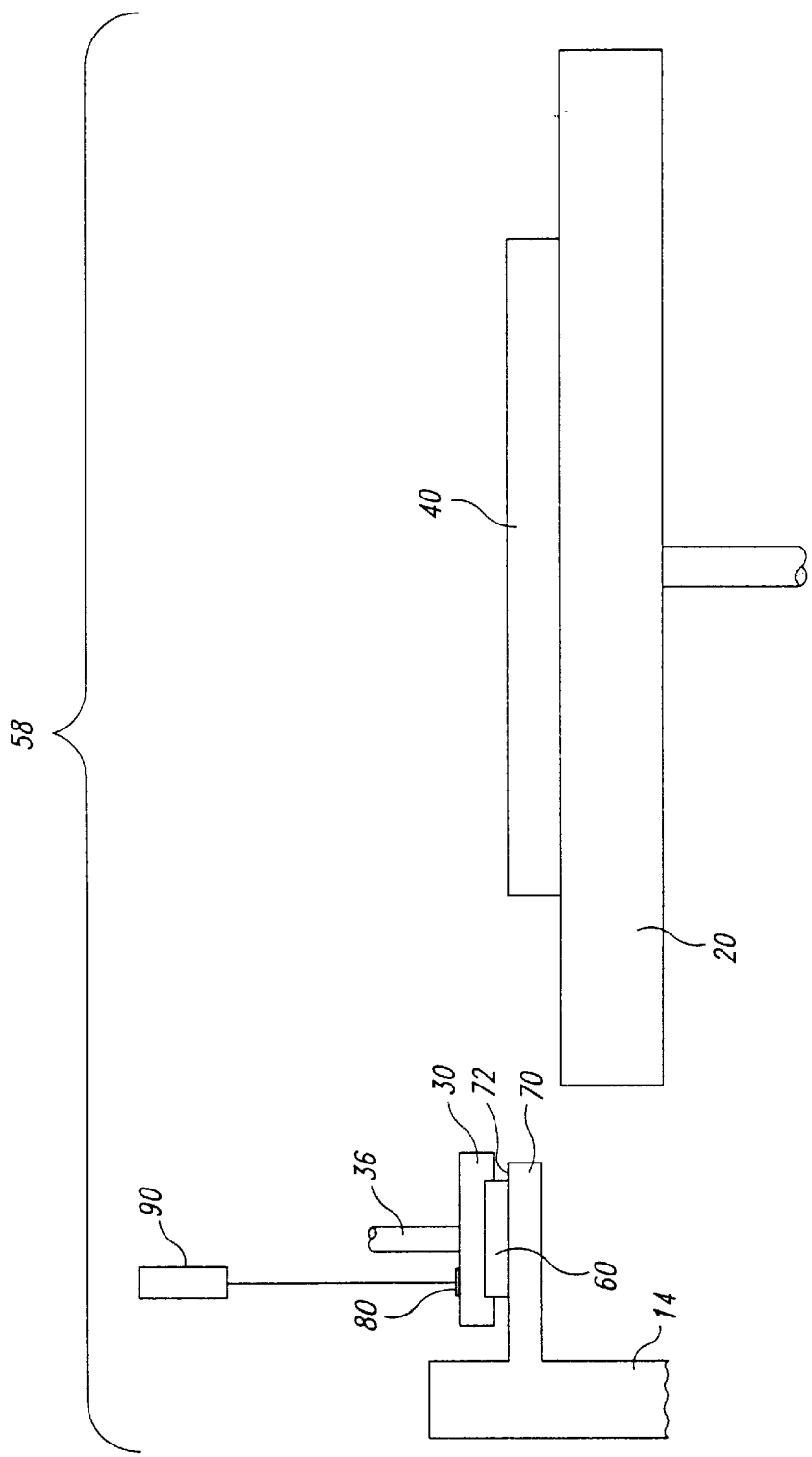
FIG. 6 is a schematic cross-sectional view of a polisher with an endpoint detector in accordance with the invention.

FIGS. 4–6 illustrate several embodiments of polishing machines with endpoint detectors. FIG. 4 shows a polishing machine 54 with an endpoint detector in which the reference platform 70 is a separate pedestal 74 that is fixed to the ground or the planarization machine. FIG. 5 shows a polishing machine 56 with an endpoint detector in which the reference platform 70 is spaced radially outwardly away from the polishing pad 40 on the surface of the platen 20. In other related embodiments, a reference platform 70($a$) may be positioned in a hole 43 at the center of the pad 40, or the hole 43 can provide access to a reference platform 70($b$) defined by the center of the upper surface 22 of the platen 20. FIG. 6 shows a polishing machine 58 with an endpoint detector in which the reference platform 70 is attached to a wall 14 of the polishing machine. In each of the polishing machines 54, 56, and 58, the change in thickness of the wafer 60 is measured by moving the wafer 60 from the polishing pad 40 to the reference platform 70. The change in displacement of the measuring face 80 is measured by engaging the measuring face 80 with a light beam from the measuring device 90, as described above with respect to FIG. 2.

An advantage of the polishing machines 52, 54, 56, and 58 is that they generally enhance the throughput of the CMP process. When the reference platform 70 is the polishing pad, the change in thickness $\Delta t$ of the wafer 60 may be measured without removing the wafer 60 from the wafer carrier 30 or the polishing pad. Accordingly, the change in thickness $\Delta t$ of the wafer 60 may be measured in situ with only minimal interruption of the polishing of the wafer 60. When the platform 72 is separate from the polishing pad, the change in thickness $\Delta t$ of the wafer 60 may be measured without removing the wafer 60 from the wafer carrier 30. Thus, the change in thickness $\Delta t$ of the wafer may be measured with only a minor interruption to move the wafer between the polishing pad and the reference platform.

Figure 7:
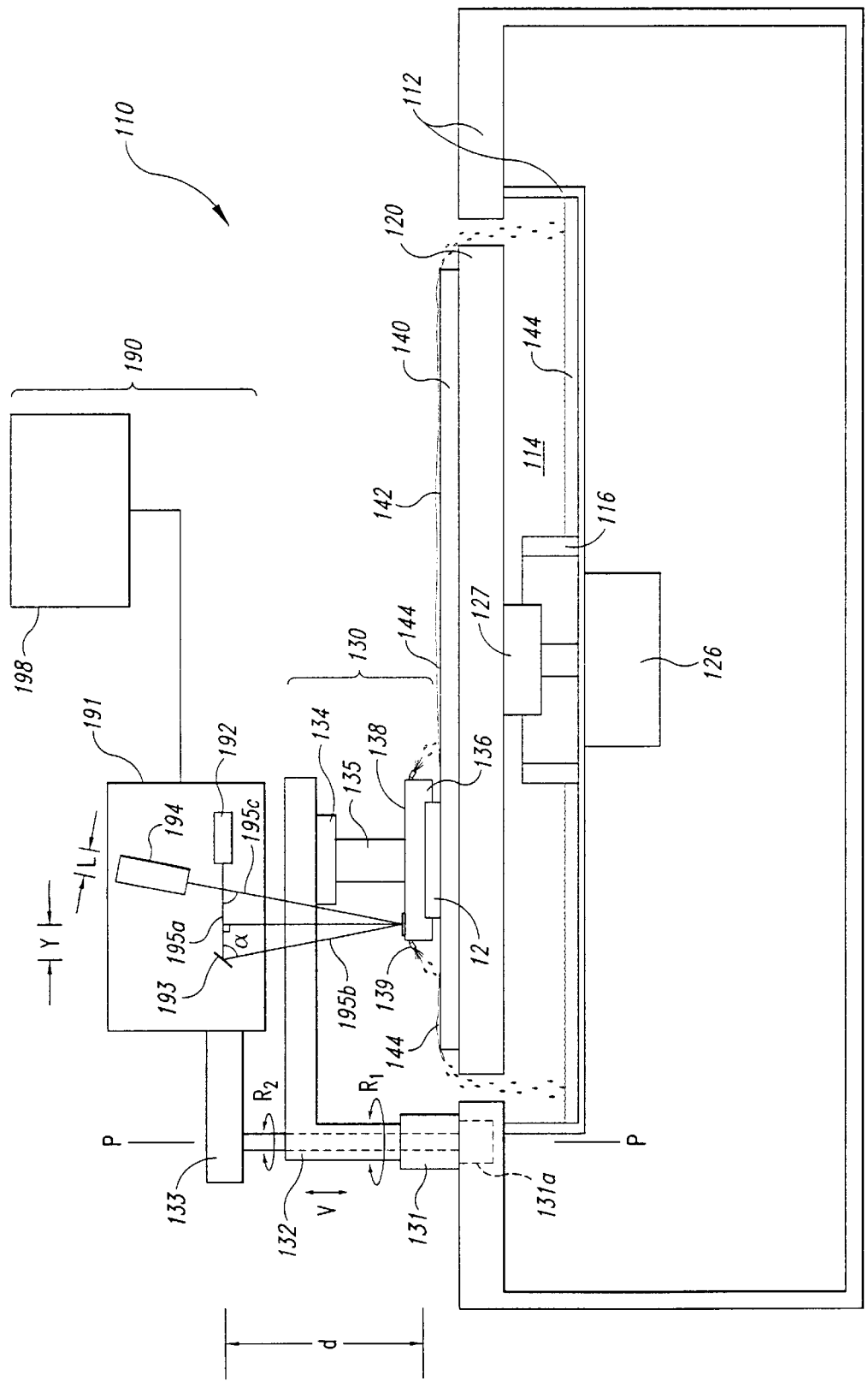
FIG. 7 is a schematic cross-sectional view of another polishing machine with a performance monitoring system in accordance with another embodiment of the invention.

FIG. 7 is a schematic cross-sectional view of a CMP machine 110 in accordance with another embodiment of the invention. The CMP machine 110 may have a housing 112, a cavity 114 in the housing 112, and a barrier 116 in the cavity 114. An actuator 126 attached to the housing 112 has a shaft 127 within the barrier 116 to support a plate or platen 120. The actuator 126 may accordingly rotate the plate 120 via the shaft 127. The planarizing machine 110 also has a carrier assembly 130 attached to the housing 112. in one embodiment, the carrier assembly 130 has a primary actuator 131 that moves a first arm 132 vertically along a sweep axis P-P (arrow V) and rotates the arm 132 along the sweep axis P-P (arrow $R_1$). The arm 132 may carry a secondary actuator 134 with a drive shaft 135 coupled to a substrate holder or wafer carrier 136. The substrate holder 136 preferably has a backside or upper face 138, a plurality of nozzles 139 for dispensing a planarizing fluid 144, and a mounting site to which a microelectronic substrate 12 may be attached. The substrate 12, for example, may be a semiconductor wafer or a field emission display with or without integrated circuitry. The carrier assembly 130 manipulates the substrate holder 136 to engage and translate the substrate 12 across a planarizing surface 142 of a planarizing medium 140 (e.g., a polishing pad).

The carrier assembly 130 may also have a second arm 133 that rotates about the sweep axis P-P (arrow $R_2$). The first and second arms 132 and 133 are preferably independently operable from another. The first arm 132 may be coupled to the primary actuator 131 to be moved with respect to the sweep axis P-P as set forth above. The second arm 133 may have a vertical portion that telescopes from the vertical portion of the first arm 132. The second arm 133 may be independently coupled to a secondary actuator 131a on the planarizing machine 110. The secondary actuator 131a may accordingly move the second arm 133 about the sweep axis P-P at a fixed or known elevation as the first arm 132 independently moves with respect to the sweep axis P-P. For example, as the first arm 132 moves vertically and rotationally about the sweep axis P-P to planarize the substrate 12, the second arm 133 may rotate about the sweep axis P-P with the first arm 132 at a constant elevation.

The planarizing machine 110 may also have a performance monitoring system 190 attached to the second aim 133. The performance monitoring system 190 may be a non-contact distance measuring device 191 ("distance device") with a beam emitter 192, a reflector 193 spaced apart from the beam emitter 192, and a detector 194. The beam emitter 192 projects a beam 195 (indicated in FIG. 7 by reference numbers 195a–c) to determine the actual elevation of the substrate holder 136. As schematically shown in FIG. 7, the beam emitter 192 may project an initial portion of a source beam 195a toward the reflector 193. The reflector 193 is inclined at an angle $\alpha$ that directs an intermediate portion of the source beam 195b to the backside 138 of the substrate holder 136 so that a detector 194 receives a return beam 195c. The detector 194 receives the return beam 195c and optically detects the lateral position "L" of the return beam 195c with respect to a scale (not shown) in the detector 194. By knowing the angle $\alpha$ to maintain an isosceles triangle and the distance "Y" along the initial source beam 195a between the apex of the triangle and the reflector, a processor 198 operatively coupled to the distance device 191 determines the actual distance "d" between the backside 138 of the substrate holder 136 and the initial portion of the source beam 195a. Accordingly, the distance device 191 measures the actual elevation of the backside 138 of the substrate holder 136.

The distance device 191 is preferably a triangular displacement meter that accurately measures the distance between the known elevation and the backside 138 of the substrate holder 136. The beam emitter 192 may accordingly be a laser, and the beam 195 may accordingly be a laser beam. One suitable laser displacement meter is the LC3 displacement meter manufactured by Keyence Corporation of Woodcliff Lake, N.J.

In operation, the distance device 191 directs the beam 195 against the backside 138 of the substrate holder 136 as the carrier assembly 130 presses the substrate 12 against the planarizing medium 140. In some applications, the distance measuring device 191 directs the beam 195 against the backside 138 of the substrate holder 136 while the substrate holder 136 and the planarizing medium 140 are stationary. In other applications, the distance measuring device 191 directs the beam 195 against the substrate holder 136 while imparting relative motion between the substrate holder 136 and the planarizing medium 140. For example, the distance device 191 and the substrate holder 136 may rotate together about the sweep axis P-P during the planarization process so that the beam 195 continuously impinges the backside 138 of the substrate holder 136. In another embodiment, the distance device 191 may be positioned at a fixed point along the planarizing path of the substrate holder 136 so that the beam 195 periodically impinges the backside 138 of the substrate holder 136 during the planarization process. In either case, the distance device 191 detects the elevation of the backside of the substrate holder 136 with respect to the known elevation by measuring a first actual distance at one stage of the planarization process and by re-measuring a second actual distance at a subsequent stage. As explained in more detail below, the distance between the known elevation and the backside 138 of the substrate holder 136 provides data to monitor the performance of the planarization process.

In one particular application, the performance monitoring system 190 of the planarizing machine 110 may detect the endpoint of the planarization process. During the planarization process as the carrier assembly 30 moves the substrate 12 across the planarizing medium 140, the distance device 191 measures the elevation of the backside 138 of the substrate holder 136. When the change in elevation of the substrate holder 136 is within a range of the desired change in thickness of the substrate 12, the planarizing machine 110 terminates the removal of material from the substrate 12. For example, the planarizing machine 110 may terminate the process by disengaging the substrate 12 from the planarizing medium 140 or stopping the relative motion between the substrate 12 and the planarizing medium 140.

The performance monitoring system 190 may also monitor other system parameters to indicate when the planarization process is not operating at a desired level. For example, the processor 198 may determine the polishing rate of the substrate 12 without interrupting the planarizing cycle by correlating the change in elevation of the substrate holder 136 with the elapsed time of the cycle. A significant change in the polishing rate generally indicates that one of the planarizing parameters is not operating within a desired range. A drop in the polishing rate, for example, may indicate that the condition of the polishing pad has deteriorated such that the pad does not uniformly remove material from the substrate. A significant change in the polishing rate may also indicate that another polishing parameter is not within a desired operating range. Therefore, the planarizing machine 110 may also monitor other system parameters to indicate whether the planarization process is operating within a desired range.

In still another application, the performance monitoring systems 190 may measure the vertical motion of the substrate holder to determine whether anomalies occur in the vertical displacement pattern of the substrate holder. In most CMP applications, the substrate holder 136 is attached to the shaft 137 by a gimbal joint. Accordingly, even though the substrate holder 136 should desirably remain level during planarization, most substrate holders have a pattern of small vertical displacement under normal operating conditions. The distance device 191 can also measure and indicate the vertical displacement pattern of the substrate holder 136 during planarization. Accordingly, if the vertical displacement pattern changes or large anomalies occur, it may indicate that the pad surface, the slurry distribution or the substrate surface is not within a normal operating range.

Therefore, the planarizing machine 110 also provides another source of information for monitoring the planarizing characteristics of the planarization process.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In the manufacturing of microelectronic devices, a method of planarizing a microelectronic device substrate, comprising:

loading the substrate in a substrate holder, the substrate holder having a front side facing the substrate and a backside facing away from the substrate;

pressing the substrate against a planarizing surface of a planarizing medium;

imparting relative motion between the substrate holder and the planarizing medium to rub the substrate against the planarizing surface;

detecting an elevation of the backside of the substrate holder while contemporaneously pressing the substrate against the planarizing surface and imparting relative motion between the substrate holder and the planarizing medium; and terminating the removal of material from the substrate when the detected elevation changes by a distance approximately equal to a desired change in thickness of the wafer.

2. The method of claim 1 wherein detecting the elevation of the backside of the substrate holder comprises contemporaneously imparting relative motion between the substrate and the planarizing medium.

3. The method of claim 2 wherein detecting the elevation of the backside of the substrate holder comprises measuring an elevation of the backside of the substrate holder from a known elevation.

4. The method of claim 3 wherein detecting the elevation of the backside of the substrate holder comprises:

measuring a first actual distance between the backside of the substrate holder and the known elevation at one stage of the planarization process; and re-measuring a second actual distance between the backside of the substrate holder and the known elevation at another stage of the planarization process.

5. The method of claim 4 wherein measuring the first actual distance comprises:

projecting an initial portion of a source beam at a reflector;

directing an intermediate portion of the source beam from the reflector to the backside of the substrate holder to create a return beam reflecting from the backside of the substrate holder; and observing a position of the return beam with a detector, the position of the return beam with respect to the detector and the angle of the reflector indicating the actual distance between the known elevation and the backside of the wafer.

6. The method of claim 5 wherein:

projecting a source beam comprises emitting a laser beam toward the reflector; and observing the position of the return beam comprises measuring a lateral displacement of the return beam with respect to the detector.

7. The method of claim 4 wherein terminating removal of material from the substrate comprises disengaging the wafer from the planarizing medium when the difference between the first and second actual distances is within the desired change in thickness of the substrate.

8. The method of claim 4 wherein measuring the first actual distance and re-measuring the second actual distance comprises:

projecting an initial portion of a source beam at a reflector;

directing an intermediate portion of the source beam from the reflector to a fixed location through which the substrate holder periodically passes during a portion of the planarizing process;

observing a first position of a return beam reflecting from the backside of the substrate holder with a detector as the substrate holder passes through the fixed location at a first stage of the planarizing process, the position of the return beam with respect to the detector and the angle of the reflector indicating the first actual distance between the known elevation and the backside of the wafer; and re-observing a second position of the return beam reflecting from the backside of the substrate holder as the substrate holder subsequently passes through the fixed location at a second stage of the planarizing process, the position of the return beam with respect to the detector and the angle of the reflector indicating the second actual distance between the known elevation and the backside of the wafer.

9. The method of claim 4 wherein measuring the first actual distance and re-measuring the second actual distance comprises:

projecting an initial portion of a source beam from a beam emitter toward a reflector;

directing an intermediate portion of the source beam from the reflector to reflect from the backside of the substrate holder so that a return beam reflecting from the backside of the substrate holder is received by a detector;

observing a position of a return beam reflecting from the backside of the substrate holder with the detector, the position of the return beam with respect to the detector and the angle of the reflector measuring an actual distance between the known elevation and the backside of the wafer; and moving the beam emitter, the reflector and the detector with the substrate holder as the substrate holder moves the substrate across the planarizing medium to continuously detect the elevation of the backside of the substrate with respect to the know elevation, the first actual distance being measured at one stage in the planarizing process and the second actual distance being re-measured at a subsequent stage in the planarizing process.

10. The method of claim 3 wherein detecting the elevation of the backside of the wafer comprises periodically detecting the elevation to determine a change in elevation of the substrate holder during the planarization process.

11. The method of claim 3, further comprising continuing to planarize the substrate when the difference between a starting elevation of the backside of the substrate holder and the detected elevation is less than a desired change in thickness of the wafer.

12. In the manufacturing of microelectronic devices, a method of planarizing a microelectronic substrate in a substrate holder, comprising:

loading the substrate in a substrate holder, the substrate holder having a front side facing the substrate and a backside facing away from the substrate;

pressing the substrate against a planarizing surface of a planarizing medium;

imparting relative motion between the substrate holder and the planarizing medium to rub the substrate against the planarizing surface;

measuring a first actual distance between the backside of a substrate holder and a known elevation above the substrate holder while contemporaneously pressing the substrate against the planarizing surface at one stage of the planarization process;

re-measuring a second actual distance between the backside of the substrate holder and the known elevation while contemporaneously pressing the substrate against the planarizing surface at another stage of the planarization process; and terminating the removal of material from the substrate when the difference between the first and second actual distances is within a desired change in thickness of the substrate.

13. The method of claim 12 wherein measuring the first actual distance comprises:

projecting an initial portion of a source beam at a reflector;

directing an intermediate portion of the source beam from the reflector to the backside of the substrate holder to create a return beam reflecting from the backside of the substrate holder; and observing a position of the return beam with a detector, the position of the return beam with respect to the detector and the angle of the reflector indicating the actual distance between the known elevation and the backside of the wafer.

14. The method of claim 13 wherein:

projecting a source beam comprises emitting a laser beam toward the reflector; and observing the position of the return beam comprises measuring a lateral displacement of the return beam with respect to the detector.

15. The method of claim 12 wherein terminating removal of material from the substrate comprises disengaging the wafer from the planarizing medium when the difference between the first and second actual distances is within the desired change in thickness of the substrate.

16. The method of claim 12 wherein measuring the first actual distance and re-measuring the second actual distance comprises:

projecting an initial portion of a source beam at a reflector;

directing an intermediate portion of the source beam from the reflector to a fixed location through which the substrate holder periodically passes during a portion of the planarizing process;

observing a first position of a return beam reflecting from the backside of the substrate holder with a detector as the substrate holder passes through the fixed location at a first stage of the planarizing process, the position of the return beam with respect to the detector and the angle of the reflector indicating the first actual distance between the known elevation and the backside of the wafer; and re-observing a second position of the return beam reflecting from the backside of the substrate holder as the substrate holder subsequently passes through the fixed location at a second stage of the planarizing process, the position of the return beam with respect to the detector and the angle of the reflector indicating the second actual distance between the known elevation and the backside of the wafer.

17. The method of claim 12 wherein measuring the first actual distance and re-measuring the second actual distance comprises:

projecting an initial portion of a source beam from a beam emitter toward a reflector;

directing an intermediate portion of the source beam from the reflector to reflect from the backside of the substrate holder so that a return beam reflecting from the backside of the substrate holder is received by a detector;

observing a position of a return beam reflecting from the backside of the substrate holder with the detector, the position of the return beam with respect to the detector and the angle of the reflector measuring an actual distance between the known elevation and the backside of the wafer; and moving the beam emitter, the reflector and the detector with the substrate holder as the substrate holder moves the substrate across the planarizing medium to continuously detect the elevation of the backside of the substrate with respect to the know elevation, the first actual distance being measured at one stage in the planarizing process and the second actual distance being re-measured at a subsequent stage in the planarizing process.

18. In the manufacturing of microelectronic devices, a method of planarizing a microelectronic substrate in a substrate holder, comprising:

engaging a microelectronic substrate against a planarizing surface of a planarizing medium;

imparting relative motion between the planarizing medium and the substrate to rub the planarizing surface against a surface of the substrate by moving at least the substrate holder;

detecting an elevation of a backside of the substrate holder as the substrate in the substrate holder engages a planarizing medium; and terminating the removal of material from the substrate when the detected elevation changes by a distance approximately equal to a desired change in thickness of the wafer.

19. The method of claim 18 wherein detecting the elevation of the backside of the substrate holder comprises contemporaneously imparting relative motion between the substrate and the planarizing medium.

20. The method of claim 19 wherein detecting the elevation of the backside of the substrate holder comprises measuring an elevation of the backside of the substrate holder from a known elevation.

21. The method of claim 20 wherein detecting the elevation of the backside of the substrate holder comprises:

measuring a first actual distance between the backside of the substrate holder and the known elevation at one stage of the planarization process; and re-measuring a second actual distance between the backside of the substrate holder and the known elevation at another stage of the planarization process.

22. The method of claim 21 wherein measuring the first actual distance comprises:

projecting an initial portion of a source beam at a reflector;

directing an intermediate portion of the source beam from the reflector to the backside of the substrate holder to create a return beam reflecting from the backside of the substrate holder; and observing a position of the return beam with a detector, the position of the return beam with respect to the detector and the angle of the reflector indicating the actual distance between the known elevation and the backside of the wafer.

23. The method of claim 22 wherein:

projecting a source beam comprises emitting a laser beam toward the reflector; and observing the position of the return beam comprises measuring a lateral displacement of the return beam with respect to the detector.

24. The method of claim 21 wherein terminating removal of material from the substrate comprises disengaging the wafer from the planarizing medium when the difference between the first and second actual distances is within the desired change in thickness of the substrate.

25. The method of claim 21 wherein measuring the first actual distance and re-measuring the second actual distance comprises:

projecting an initial portion of a source beam at a reflector;

directing an intermediate portion of the source beam from the reflector to a fixed location through which the substrate holder periodically passes during a portion of the planarizing process;

observing a first position of a return beam reflecting from the backside of the substrate holder with a detector as the substrate holder passes through the fixed location at a first stage of the planarizing process, the position of the return beam with respect to the detector and the angle of the reflector indicating the first actual distance between the known elevation and the backside of the wafer; and re-observing a second position of the return beam reflecting from the backside of the substrate holder as the substrate holder subsequently passes through the fixed location at a second stage of the planarizing process, the position of the return beam with respect to the detector and the angle of the reflector indicating the second actual distance between the known elevation and the backside of the wafer.

26. The method of claim 21 wherein measuring the first actual distance and re-measuring the second actual distance comprises:

projecting an initial portion of a source beam from a beam emitter toward a reflector;

directing an intermediate portion of the source beam from the reflector to reflect from the backside of the substrate holder so that a return beam reflecting from the backside of the substrate holder is received by a detector;

observing a position of a return beam reflecting from the backside of the substrate holder with the detector, the position of the return beam with respect to the detector and the angle of the reflector measuring an actual distance between the known elevation and the backside of the wafer; and moving the beam emitter, the reflector and the detector with the substrate holder as the substrate holder moves the substrate across the planarizing medium to continuously detect the elevation of the backside of the substrate with respect to the know elevation, the first actual distance being measured at one stage in the planarizing process and the second actual distance being re-measured at a subsequent stage in the planarizing process.

27. In the manufacturing of microelectronic devices, a method of planarizing a microelectronic substrate in a substrate holder, comprising:

pressing a microelectronic substrate against a planarizing surface of a planarizing medium;

imparting relative motion between the planarizing medium and the substrate to remove material from a surface of the substrate;

measuring a first actual distance between a backside of the substrate holder and a known elevation above the substrate holder while contemporaneously pressing the substrate against the planarizing surface;

re-measuring a second actual distance between the backside of the substrate holder and the known elevation while contemporaneously pressing the substrate against the planarizing surface at another stage of the planarization process; and terminating the removal of material from the substrate when the difference between the first and second actual distances is within a desired change in thickness of the substrate.

28. The method of claim 27 wherein measuring the first actual distance comprises:

projecting an initial portion of a source beam at a reflector;

directing an intermediate portion of the source beam from the reflector to the backside of the substrate holder to create a return beam reflecting from the backside of the substrate holder; and observing a position of the return beam with a detector, the position of the return beam with respect to the detector and the angle of the reflector indicating the actual distance between the known elevation and the backside of the wafer.

29. The method of claim 28 wherein:

projecting a source beam comprises emitting a laser beam toward the reflector; and observing the position of the return beam comprises measuring a lateral displacement of the return beam with respect to the detector.

30. The method of claim 27 wherein terminating removal of material from the substrate comprises disengaging the wafer from the planarizing medium when the difference between the first and second actual distances is within the desired change in thickness of the substrate.

31. The method of claim 27 wherein measuring the first actual distance and re-measuring the second actual distance comprises:

projecting an initial portion of a source beam at a reflector;

directing an intermediate portion of the source beam from the reflector to a fixed location through which the substrate holder periodically passes during a portion of the planarizing process;

observing a first position of a return beam reflecting from the backside of the substrate holder with a detector as the substrate holder passes through the fixed location at a first stage of the planarizing process, the position of the return beam with respect to the detector and the angle of the reflector indicating the first actual distance between the known elevation and the backside of the wafer; and re-observing a second position of the return beam reflecting from the backside of the substrate holder as the substrate holder subsequently passes through the fixed location at a second stage of the planarizing process, the position of the return beam with respect to the detector and the angle of the reflector indicating the second actual distance between the known elevation and the backside of the wafer.

32. The method of claim 27 wherein measuring the first actual distance and re-measuring the second actual distance comprises:

projecting an initial portion of a source beam from a beam emitter toward a reflector;

directing an intermediate portion of the source beam from the reflector to reflect from the backside of the substrate holder so that a return beam reflecting from the backside of the substrate holder is received by a detector;

observing a position of a return beam reflecting from the backside of the substrate holder with the detector, the position of the return beam with respect to the detector and the angle of the reflector measuring an actual distance between the known elevation and the backside of the wafer; and moving the beam emitter, the reflector and the detector with the substrate holder as the substrate holder moves the substrate across the planarizing medium to continuously detect the elevation of the backside of the substrate with respect to the know elevation, the first actual distance being measured at one stage in the planarizing process and the second actual distance being re-measured at a subsequent stage in the planarizing process.

33. In the manufacturing of microelectronic devices, a method of monitoring performance of a planarization process for removing material from a microelectronic device substrate in a substrate holder, comprising:

loading the substrate in a substrate holder, the substrate holder having a front side facing the substrate and a backside facing away from the substrate;

pressing the substrate against a planarizing surface of a planarizing medium;

imparting relative motion between the substrate holder and the planarizing medium to rub the substrate against the planarizing surface;

measuring an elevation of a backside of the substrate holder while contemporaneously pressing the substrate against the planarizing surface; and evaluating whether a performance characteristic of the planarization process is within an acceptable range based upon the measured elevation of the substrate holder.

34. The method of claim 33 wherein measuring an elevation of the backside of the substrate holder comprises contemporaneously imparting relative motion between the substrate and the planarizing medium to simultaneously remove material from a surface of the substrate.

35. The method of claim 34 wherein measuring an elevation of the backside of the substrate holder comprises measuring a distance between a known elevation and the backside of the substrate holder.

36. The method of claim 35 wherein the performance characteristic is an endpoint of the planarizing process and evaluating the endpoint comprises:

comparing a change in elevation of the substrate holder based upon at least first and second measurements of the substrate elevation with respect to the known elevation during planarization; and terminating the removal of material from the substrate when the change in elevation of the substrate holder is approximately equal to a desired change in thickness of the wafer.

37. The method of claim 35 wherein the performance characteristic is a polishing rate of the planarizing process and evaluating the polishing rate comprises:

correlating elevation measurements of the substrate holder with respect to an elapsed time of the process to determine the polishing rate of the substrate during the planarizing process; and interrupting the planarizing process when the polishing rate is not in a desired operating range.

38. The method of claim 37, further comprising investigating the condition of the polishing medium during an interruption caused by a drop in the polishing rate below a desired threshold.

39. The method of claim 35 wherein the planarizing characteristic is a vertical motion of the substrate holder during planarization and evaluating the vertical motion comprises:

determining a vertical displacement pattern of the substrate holder according to the measured elevation of the substrate holder during planarization;

assessing whether the vertical displacement pattern of the substrate holder has anomalies; and interrupting the planarizing process when an anomaly occurs in the vertical displacement pattern.

* * * * *

UNITED STATES PATENT AND TRADEMARK OFFICE
CERTIFICATE OF CORRECTION

PATENT NO.    : 6,301,006 B1
DATED         : October 9, 2001
INVENTOR(S)   : Doan It is certified that error appears in the above-identified patent and that said Letters Patent is hereby corrected as shown below:

<u>Title page, Item [54] and Column 1, lines 1-3,</u>
Title of Invention should be -- ENDPOINT DETECTOR AND METHOD FOR MEASURING A CHANGE IN WAFER THICKNESS IN CHEMICAL-MECHANICAL POLISHING OF SEMICONDUCTOR WAFERS AND OTHER MICROELECTRONIC SUBSTRATES --;

<u>Column 12,</u>
Line 27, "know" should be -- known --;

<u>Column 15,</u>
Line 28, "know" should be -- known --;

Signed and Sealed this

Twenty-second Day of July, 2003

JAMES E. ROGAN
*Director of the United States Patent and Trademark Office*